(12) United States Patent
Kuchi et al.

(10) Patent No.: US 11,706,064 B2
(45) Date of Patent: Jul. 18, 2023

(54) METHOD OF RECEIVING SIGNAL STREAM AND A RECEIVER

(71) Applicants: INDIAN INSTITUTE OF TECHNOLOGY HYDERABAD, Sangareddy (IN); WISIG NETWORKS PRIVATE LIMITED, Hyderabad (IN)

(72) Inventors: Kiran Kumar Kuchi, Hyderabad (IN); Sibgath Ali Khan Makandar, Sangareddy (IN); Koteswara Rao Gudimitla, Sangareddy (IN); Saidhiraj Amuru, Hyderabad (IN)

(73) Assignees: INDIAN INSTITUTE OF TECHNOLOGY HYDERABAD; WISIG NETWORKS PRIVATE LIMITED

( * ) Notice: Subject to any disclaimer, the term of this patent is extended or adjusted under 35 U.S.C. 154(b) by 13 days.

(21) Appl. No.: 17/058,273

(22) PCT Filed: May 31, 2019

(86) PCT No.: PCT/IN2019/050424
§ 371 (c)(1),
(2) Date: Nov. 24, 2020

(87) PCT Pub. No.: WO2019/229774
PCT Pub. Date: Dec. 5, 2019

(65) Prior Publication Data
US 2021/0091984 A1 Mar. 25, 2021

(30) Foreign Application Priority Data
May 31, 2018 (IN) .............................. 201841020438

(51) Int. Cl.
*H04L 27/01* (2006.01)
*H04L 25/02* (2006.01)

(52) U.S. Cl.
CPC .......... *H04L 27/01* (2013.01); *H04L 25/0202* (2013.01)

(58) Field of Classification Search
CPC ..... H04L 27/01; H04L 25/0202; H04L 25/03; H04L 25/03006; H04L 25/03178;
(Continued)

(56) References Cited

U.S. PATENT DOCUMENTS 7,463,703 B2 * 12/2008 McElwain .......... H03M 13/658
375/320
7,583,757 B2 * 9/2009 McElwain ........... H04B 1/7107
375/316
(Continued)

FOREIGN PATENT DOCUMENTS

EP     2 048 842       1/2017

OTHER PUBLICATIONS

International Search Report and Written Opinion corresponding to International Patent Application No. PCT/IN2019/050424, dated Sep. 12, 2019.

*Primary Examiner* — James M Perez
(74) *Attorney, Agent, or Firm* — McAndrews, Held & Malloy, Ltd.

(57) ABSTRACT

Embodiments of the present disclosure are related to a receiver and a method for receiving signal. The method comprises estimating, by a receiver, channel for each of a plurality of antennas using the received signal stream, to produce a plurality of estimated channels. Also, method comprises grouping a predetermined number of received signals from the received signal stream and estimated channels associated with the received signals to obtain a plurality (Continued)

of groups. Further, a group specific filtering is performed on the received signals and corresponding estimated channels of each of the plurality of groups to obtain filtered received signals and a plurality of filtered estimated channels. Thereafter, the method comprises performing second filtering on all the filtered received signals to produce second filtered signals, which are processed to produce an output.

18 Claims, 6 Drawing Sheets

(58) Field of Classification Search
CPC ......... H04L 25/03299; H04L 25/03891; H04L 25/03987; H04L 25/03949; H04L 25/03961; H04L 25/03968; H04L 25/0399
See application file for complete search history.

(56) References Cited

U.S. PATENT DOCUMENTS

| | | | | |
|---|---|---|---|---|
| 7,590,203 B2* | 9/2009 | McElwain | .............. | H04L 1/005 375/349 |
| 7,830,975 B2* | 11/2010 | Kuchi | ..................... | H04L 27/22 375/267 |
| 7,920,651 B2* | 4/2011 | McElwain | ........ | H03M 13/6331 375/316 |
| 8,107,572 B1* | 1/2012 | Furman | ............. | H04L 25/03057 370/335 |
| 8,325,844 B2* | 12/2012 | Walton | ................. | H04B 7/0678 375/267 |
| 8,335,286 B2* | 12/2012 | Mergen | ............. | H04L 1/1845 375/349 |
| 8,391,429 B2* | 3/2013 | Mergen | ..................... | H04L 1/06 375/349 |
| 8,411,806 B1* | 4/2013 | Lee | ................... | H04L 25/03891 375/349 |
| 8,483,641 B1* | 7/2013 | Mayrench | ............ | H04B 1/1027 455/226.1 |
| 8,665,977 B2* | 3/2014 | Cheng | ............... | H04L 25/03242 375/325 |
| 8,694,851 B1* | 4/2014 | Sun | ................... | H03M 13/6331 714/758 |
| 8,699,448 B2* | 4/2014 | Lindqvist | ............. | H04J 11/0046 370/341 |
| 8,711,994 B2* | 4/2014 | Mergen | ............. | H04B 1/71072 375/349 |
| 9,094,029 B2* | 7/2015 | Xu | ......................... | H04L 1/203 |
| 9,148,325 B2* | 9/2015 | Hamila | ............... | H04L 27/3863 |
| 9,191,080 B2* | 11/2015 | Yokomakura | ........ | H04B 7/0413 |
| 9,374,722 B1* | 6/2016 | Hombs | ................. | H04L 25/021 |
| 9,407,303 B2* | 8/2016 | Menon | ..................... | H04B 7/08 |
| 9,602,178 B2* | 3/2017 | Ribeiro | ............... | H04B 7/0848 |
| 9,787,337 B2* | 10/2017 | Caretti | ..................... | H04B 1/10 |
| 9,954,596 B2* | 4/2018 | Wu | ..................... | H04L 25/0228 |
| 10,476,709 B2* | 11/2019 | Horvat | ................. | H04B 7/0413 |
| 11,184,205 B2* | 11/2021 | Matsumura | ............. | H04L 27/26 |
| 11,240,083 B2* | 2/2022 | Radosevic | ........... | H04L 27/2628 |
| 11,489,568 B2* | 11/2022 | Kuchi | ................... | H04B 7/0626 |
| 2003/0125040 A1* | 7/2003 | Walton | ................ | H04B 7/0626 455/454 |
| 2005/0036575 A1* | 2/2005 | Kuchi | ............... | H04L 25/03178 375/348 |
| 2005/0226344 A1* | 10/2005 | Kuchi | ..................... | H04L 27/22 375/267 |
| 2006/0047842 A1* | 3/2006 | McElwain | .......... | H04L 25/0262 709/231 |
| 2006/0222096 A1* | 10/2006 | Guo | ..................... | H04L 27/2647 375/260 |
| 2009/0037597 A1* | 2/2009 | McElwain | ............. | H04L 1/005 709/231 |
| 2009/0067553 A1* | 3/2009 | McElwain | .......... | H04L 25/0262 375/341 |
| 2009/0290667 A1* | 11/2009 | McElwain | ........ | H03M 13/2957 375/350 |
| 2010/0104037 A1* | 4/2010 | Jongren | ................ | H04L 1/0606 370/328 |
| 2010/0195711 A1* | 8/2010 | Hasan | ..................... | H04L 27/01 375/232 |
| 2012/0243502 A1* | 9/2012 | Lindqvist | ............. | H04J 11/0046 370/330 |
| 2013/0243069 A1* | 9/2013 | Guo | .................. | H04L 25/03891 375/232 |
| 2014/0086148 A1* | 3/2014 | Ma | ......................... | H04B 7/024 370/328 |
| 2014/0160949 A1* | 6/2014 | Clausen | ................ | H04L 5/0073 370/252 |
| 2014/0242934 A1* | 8/2014 | Guo | ........................ | H04B 1/16 455/273 |
| 2015/0023443 A1* | 1/2015 | Menon | ............. | H04L 25/03993 375/267 |
| 2015/0030092 A1* | 1/2015 | Krishnamurthy | .... | H04B 7/0421 375/267 |
| 2015/0172006 A1* | 6/2015 | Wang | ..................... | H04L 1/1829 370/329 |
| 2015/0372727 A1* | 12/2015 | Ribeiro | ................ | H04B 7/0848 375/267 |
| 2016/0087741 A1* | 3/2016 | Levakov | ............. | H04L 25/0204 370/329 |
| 2016/0344459 A1* | 11/2016 | Chen | .................... | H04B 7/0854 |
| 2017/0207898 A1* | 7/2017 | Yang | ..................... | H04L 5/0048 |
| 2017/0245173 A1* | 8/2017 | Qian | .................. | H04L 25/0204 |
| 2017/0324462 A1* | 11/2017 | Chen | ......................... | H04B 7/08 |
| 2018/0034532 A1* | 2/2018 | Wu | ......................... | H04L 27/26 |
| 2018/0248719 A1* | 8/2018 | Horvat | ............. | H04L 25/03891 |
| 2021/0091984 A1* | 3/2021 | Kuchi | ................. | H04B 1/1027 |
| 2021/0288859 A1* | 9/2021 | Radosevic | ............. | H04L 27/01 |
| 2022/0131580 A1* | 4/2022 | Kuchi | ................... | H04B 7/0456 |
| 2022/0131734 A1* | 4/2022 | Radosevic | ........ | H04L 27/26412 |
| 2022/0224361 A1* | 7/2022 | Alic | ................... | H03M 13/2957 |
| 2022/0393817 A1* | 12/2022 | Kuchi | ................... | H04L 5/0023 |
| 2022/0416859 A1* | 12/2022 | Kuchi | ................... | H04B 7/0626 |

\* cited by examiner

METHOD OF RECEIVING SIGNAL STREAM AND A RECEIVER

CROSS-REFERENCE TO RELATED APPLICATIONS

The present application is a national stage application under 35 U.S.C. § 371 of application Serial No. PCT/IN2019/050424, filed on May 31, 2019, and entitled "A METHOD OF RECEIVING SIGNAL STREAM AND A RECEIVER." The aforementioned application is hereby incorporated herein by reference in its entirety.

TECHNICAL FIELD

Embodiments of the present disclosure are related, in general to communication, but exclusively relate to a method and system for receiving data by removing interference and noise.

BACKGROUND

Currently, large antenna systems such as, but not limited to 64, 128 employ Minimum Mean Square Error-interference rejection combiner (MMSE-IRC) equalizers. One of the main components of this equalizer design is estimation of noise covariance matrix, which in general will be estimated one per PRB and the same will be used across that PRB to design the MMSE filter. For a large antenna system like 64 receive antennas, Noise covariance matrix will be of size 64*64. Estimating 64*64 matrix from 12 elements of a PRB will result in under dimension system and the resultant Noise covariance matrix will be ill conditioned, which subsequently lead to faulty decoding of data.

SUMMARY

The shortcomings of the prior art are overcome and additional advantages are provided through the provision of method of the present disclosure.

Additional features and advantages are realized through the techniques of the present disclosure. Other embodiments and aspects of the disclosure are described in detail herein and are considered a part of the claimed disclosure.

In an aspect of the present disclosure, a method of receiving a signal stream in a communication network is provided. The method comprises estimating, by a receiver, channel for each of a plurality of antennas using the received signal stream, to produce a plurality of estimated channels. Also, method comprises grouping a predetermined number of received signals from the received signal stream and estimated channels associated with the predetermined number of received signals to obtain a group, and repeating grouping operation for remaining received signals of the received signal stream to generate a plurality of groups. Further, the method comprises performing group specific filtering on the received signals and corresponding estimated channels of each of the plurality of groups to obtain a filtered plurality of groups, each of the filtered plurality of groups comprises filtered received signals and a plurality of filtered estimated channels. Furthermore, the method comprises performing second filtering for all the filtered received signals corresponding to all the plurality of groups to produce second filtered signals and processing the second filtered signals to produce an output.

Another aspect of the present disclosure is a receiver for receiving signal stream in a communication network. The receiver comprises a plurality of antennas, a channel estimator, an equalizer and a processing unit. The plurality of antennas is configured to receive the signal stream. The channel estimator estimates channel for each a plurality of antennas using the received signal stream, to produce a plurality of estimated channels. The equalizer filters the received signal stream, comprises a grouping unit, a group specific filter and a second filter. The grouping unit groups a predetermined number of received signals from the received signal stream and estimated channels associated with the predetermined number of received signals to obtain a plurality of groups. The group specific filter performs group specific filtering on the received signals and corresponding estimated channels of each of the plurality of groups to obtain a filtered plurality of groups, each of the filtered plurality of groups comprises filtered received signals and a plurality of filtered estimated channels. The second filter filters all the filtered received signals corresponding to all the plurality of groups to produce second filtered signals. The processing unit processes the second filtered signals to produce an output.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE ACCOMPANYING DRAWINGS

The accompanying drawings, which are incorporated in and constitute a part of this disclosure, illustrate exemplary embodiments and, together with the description, serve to explain the disclosed principles. In the figures, the left-most digit(s) of a reference number identifies the figure in which the reference number first appears. The same numbers are used throughout the figures to reference like features and components. Some embodiments of device or system and/or methods in accordance with embodiments of the present subject matter are now described, by way of example only, and with reference to the accompanying figures, in which:

DETAILED DESCRIPTION

Figure 1:
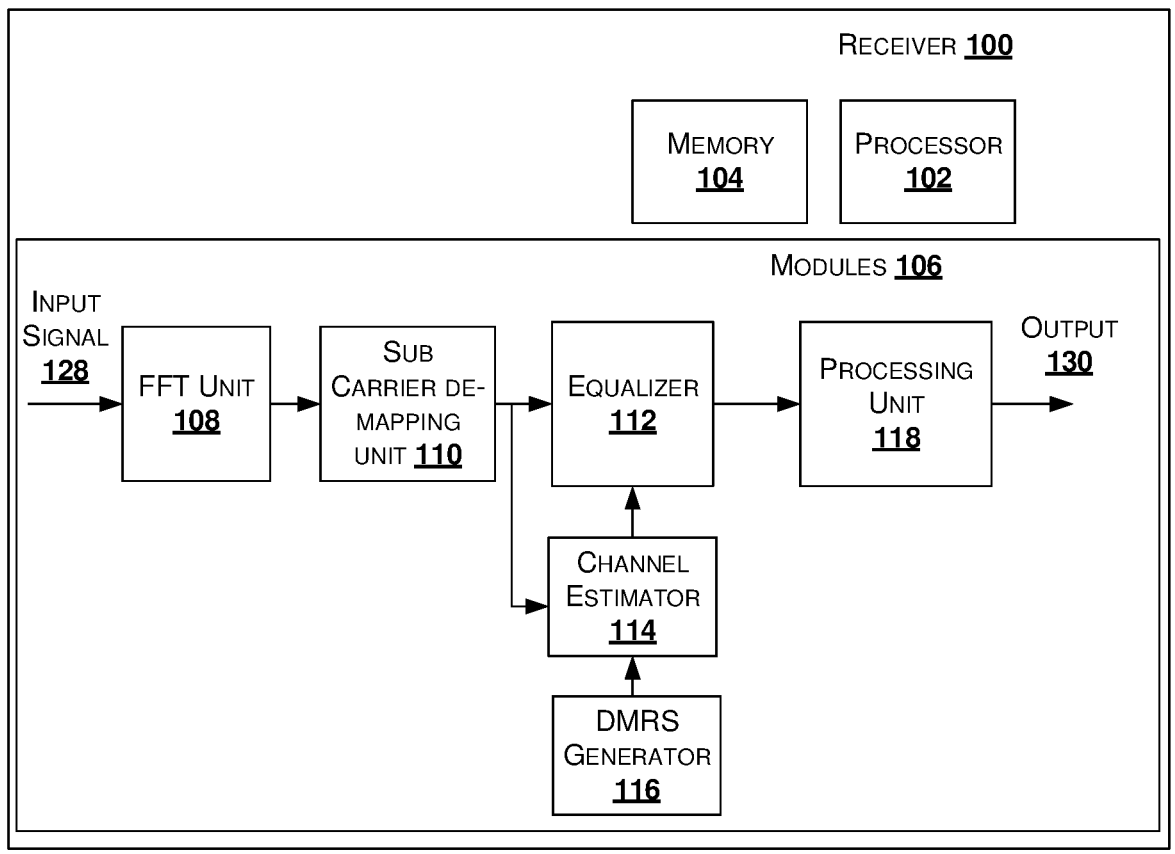
FIG. 1 shows a block diagram of a receiver for receiving signal stream, in accordance with an embodiment of the present disclosure.

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

While the disclosure is susceptible to various modifications and alternative forms, specific embodiment thereof has been shown by way of example in the drawings and will be described in detail below. It should be understood, however that it is not intended to limit the disclosure to the particular forms disclosed, but on the contrary, the disclosure is to cover all modifications, equivalents, and alternative falling within the spirit and the scope of the disclosure.

The terms "comprises", "comprising", or any other variations thereof, are intended to cover a non-exclusive inclusion, such that a setup, device or method that comprises a list of components or steps does not include only those components or steps but may include other components or steps not expressly listed or inherent to such setup or device or method. In other words, one or more elements in a device or system or apparatus proceeded by "comprises . . . a" does not, without more constraints, preclude the existence of other elements or additional elements in the device or system or apparatus.

The terms "an embodiment", "embodiment", "embodiments", "the embodiment", "the embodiments", "one or more embodiments", "some embodiments", and "one embodiment" mean "one or more (but not all) embodiments of the invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise. The terms "a", "an" and "the" mean "one or more", unless expressly specified otherwise.

Embodiments of the present disclosure relate to a receiver and a method for receiving signal stream or plurality of signals. The receiver comprises a plurality of antennas, a channel estimator, an equalizer and a processing unit. The plurality of antennas is configured to receive the signal stream. The channel estimator estimates channel for each a plurality of antennas using the received signal stream, to produce a plurality of estimated channels. The equalizer filters the received signal stream, comprises a grouping unit, a group specific filter and a second filter. The grouping unit groups a predetermined number of received signals from the received signal stream and estimated channels associated with the predetermined number of received signals to obtain a plurality of groups. The group specific filter performs group specific filtering on the received signals and corresponding estimated channels of each of the plurality of groups to obtain a filtered plurality of groups, each of the filtered plurality of groups comprises filtered received signals and a plurality of filtered estimated channels. The second filter filters all the filtered received signals corresponding to all the plurality of groups to produce second filtered signals. The processing unit processes the second filtered signals to produce an output.

FIG. 1 shows a block diagram of a receiver for receiving signal stream, in accordance with an embodiment of the present disclosure.

As shown in FIG. 1, the receiver 100 also referred as a communication system comprises processor 102, memory 104, modules 106 and a plurality of antennas (not shown in the Figure). The memory 104 may be communicatively coupled to the processor 102. The processor 102 may be configured to perform one or more functions of the receiver 100 for receiving data. The plurality of antennas, is configured in the receiver, to receive a signal stream, also referred as a plurality of signals or signal. In one implementation, the receiver 100 may comprise modules 106, also referred as blocks or units, for performing various operations in accordance with the embodiments of the present disclosure.

The modules 106 include Fast Fourier Transform (FFT) unit 108, sub carrier de-mapping unit 110, an equalizer 112, channel estimator 114, demodulation reference signal (DMRS) generator 116 and processing unit 118. In an embodiment, the receiver comprises an input module comprising front end processing unit, cyclic prefix (CP) removal module, followed by one of discrete Fourier transform (DFT) and Fast Fourier transform (FFT) unit. The processing unit 118 comprises log-likelihood ratio (LLR) module, De-scrambler, code block de-concatenator, de-rate matcher, channel decoder, CRC (cyclic redundancy check) and code block de-segmentation module and CRC module. The receiver 100 provides an optimized channel estimation and interference rejection combiner (IRC) Minimum Mean Square Error (MMSE) Equalizer for 5G NR physical uplink shared channel (PUSCH). In an embodiment, the receiver is implemented in a base station.

As shown in FIG. 1, the input signal 128 is the pre-processed received signal by the receiver 100. The input signal 128 is also referred as signal stream or received signal stream or plurality of signals or plurality of received signals or received signals. In an embodiment, the input signal 128 is one of binary phase shift keying (BPSK), Quadrature Phase Shift Keying (QPSK), quadrature amplitude multiplexing (QAM) and the like.

In one embodiment, the receiver 100 may comprise a front end processing unit and cyclic prefix unit (both not shown in Figure). The front end processing unit pre-processes the received signal by performing at least one of converting the received signal in to intermediate frequency signal. The cyclic prefix (CP) unit, also referred as CP remover, removes cyclic prefix associated with the intermediate frequency signal.

The FFT unit 108 performs the FFT on the received signal stream to transform time domain signal stream to frequency domain signal stream, which is referred as transformed signal stream. Further, the sub carrier de-mapping unit 110 maps the transformed signal stream using a plurality of sub-carriers to generate de-mapped signals, also referred as de-mapped transformed signals.

The equalizer 112 equalizes the de-mapped signals using the estimated channel by removing at least one of interference and noise to produce equalized signal. The estimated channel is determined for each antenna, by the channel estimator 114. FIG. 2C shows a block diagram of an equalizer, in accordance with an embodiment of the present disclosure.

As shown in in FIG. 2C, the equalizer 112 comprises a grouping unit 202, a group specific filter, also referred as an interference rejection combiner (IRC) 204 and a second filter, also referred as a minimum mean square error (MMSE) filter 206. The grouping unit 202 groups a predetermined number of received signals from the received signal stream and estimated channels associated with the predetermined number of received signals to obtain a group. The grouping operation is repeated for remaining received signals of the received signal stream to generate a plurality of groups. In an embodiment, the grouping is performed for the received signal stream from a de-mapper i.e. using a plurality of de-mapped signals received from the de-mapper, to produce a plurality of groups. The plurality of de-mapped signals is associated with the corresponding plurality of antennas.

The group specific filter or IRC 204 performs group specific filtering on the received signals and corresponding estimated channels of each of the plurality of groups to obtain a filtered plurality of groups. Each of the filtered plurality of groups comprises filtered received signals and a plurality of filtered estimated channels. The IRC 204 performs the group specific filtering on the received signals and corresponding estimated channels associated with each of the plurality of groups to remove interference and noise, using corresponding group channel estimate to obtain filtered plurality of groups. The filtered plurality of groups is also referred as whitened plurality of groups.

The second filter or the MMSE filter 206 filters all the filtered received signals, corresponding to all the filtered plurality of groups, to produce second filtered signals. The second filtered signals may be referred as equalized signals. To obtain equalized signals, the second filter 206 merges all the filtered received signals corresponding to the filtered plurality of groups received from the IRC 204. Thereafter, the MMSE filer 206 filters the merged filtered received signals using one of minimum mean square error (MMSE) filter, matched filter, maximum ratio combining and the like, to produce equalized signals.

Referring back to FIG. 1, the channel estimator 114 estimates channel using DMRS signals, which are generated by the DMRS generator 116.

The DMRS generator 116 generates DMRS from the received signal, at the receiver. The DMRS are UE specific reference signals used for channel estimation. In 5G NR, for cyclic prefix Orthogonal frequency-division multiplexing (CP-OFDM) the DMRS is a unique QPSK sequence generated using a PN sequence. Thereafter, the QPSK sequence is mapped to antenna ports based on the number of layers and number of UEs multiplexed. The DMRS generator generates the DMRS using one of pseudo-random sequence generation, base sequence generation and mapping to antenna ports.

In one embodiment, the DMRS generator 116 uses Pseudo Random sequence generation, for obtaining DMRS. The pseudo-random sequences are defined by 31-length Gold sequences. The generation of pseudo-random sequence is performed using below equation 1, that is output sequence "c(n)" of length $M_{PN}$ is generated by:

$$c(n) = (x_1(n+N_c) + x_2(n+N_c)) \bmod 2 \quad (1)$$

where,
$N_c = 1600$,
$n = \{0, 1, 2, 3 \ldots M_{PN}\}$

The sequences $x_1(n)$ and $x_2(n)$ are 31-length sequences are given by, $$x_1(0) = 1, x_1(n) = 0, n = \{1,2,3, \ldots 30\}$$

$$c_{init} = \Sigma_{i=0}^{30} x_2 \quad (i)$$

For the lengths greater than 31, the values of $x_1(n)$ and $x_2(n)$ is calculated from, $$x_1(n+31) = (x_1(n+3) + (n)) \bmod 2$$

$$x_2(n+31) = (x_2(n+3) + x_2(n+2) + x_2(n+1) + x_2(n)) \bmod 2$$

$c_{init}$ is calculated using below equation:

$$c_{init} = (2^{17}(N_{symb}^{slot} n_{s,f}^{\mu} + l + 1)(2N_{ID}^{nSCID} + 1) + 2N_{ID}^{nSCID} + n_{SCID}) \bmod 2^{31}$$

Obtaining $n_{SCID}$

```
If (n_SCID_DCI ==1),    (if presented in the associated DCI)
    n_SCID = {0 or 1}   (obtained from DCI)
Else
    n_SCID = 0
```

Obtaining $N_{ID}^{nSCID}$

```
If (scramblingID0_DCI == 1 && scramblingID1_DCI == 1)
    N_ID_0 = {0 ... ... 65535}
    N_ID_1 = {0 ... ... 65535}
Else if (scramblingID0 == 1)
    N_ID_0 = {0 ... ... 65535}
Else
    N_ID^nSCID = N_ID^CELL
```

The sequence length depends on the configuration type, that is:

$$M_{PN} = \frac{(N_{SC} \times 2)}{C}$$

where, $$C = \begin{cases} 2, \text{ for configuration type 1} \\ 3, \text{ for configuration type 2} \end{cases}$$

The Pseudo code is generated as:

```
N_C = 1600
C_init
x_1(n) = {1,0,0, ... ... ,0}
Calculate x_2(n) = binary(C_init) (of length 32)
n = 0
While n < M_PN + N_c - 1
    x_1(n + 31) = (x_1(n + 3) + x_1(n))mod2
    x_2(n + 31) = (x_2(n + 3) + x_2(n + 2) + x_2(n +1) + x_2(n))mod2
    n = n + 1;
For n = 0
While n < M_PN - 1
    c(n) = (x_1(n + N_c) + x_2(n + N_c))mod2
    n = n + 1
```

In one embodiment, the DMRS generator 116 uses base sequence generation, for obtaining DMRS. The base sequence, r(n) is a QPSK sequence, which is generated using the pseudo sequence by $$r(n) = \frac{1}{\sqrt{2}}(1 - 2c(2n)) + j\frac{1}{\sqrt{2}}(1 - 2c(2n + 1))$$

The sequence r(n) is the base sequence for all the layers of a UE, which are scheduled on a particular time-frequency resource grid and is unique for every symbol. The sequence may vary for UEs depending on the scrambling IDs.

As the pseudo-random sequence length depends on configuration type, the base sequence length also depends on the configuration type. The effect of this may be clearly seen in mapping to the physical resource. One embodiment of the present disclosure is mapping to physical resources. Thus, minimizing the inter-layer or UE interference, an intermediate port mapping is to be performed which ensures orthogonality via code division multiplexing (CDM) and frequency division multiplexing (FDM) respectively.

The base sequence is mapped to $\tilde{a}_{k,l}^{(\tilde{p},\mu)}$ by, $$\tilde{a}_{k,l}^{(\tilde{p},\mu)} = w_f(k')w_t(l')r(2n+k')$$

where, n=0, 1, 2, . . . .

j=0, 1, 2 . . . v−1

Mapping to $\tilde{a}_{k,l}^{(\tilde{p}j\mu)}$ include calculation of symbol number 'l' and calculation of tone number 'k'. The symbol number l is given by, l=$\bar{l}$+l'

In 5G-NR, the DMRS is front-loaded that is either occupying the first symbol i.e. single front-loaded DMRS or first two symbols i.e. double front loaded DMRS. The reference point for the symbol 'l' is defined on the basis of mapping type (A or B). In the case of mapping type A, the position of front-loaded DMRS 'l$_0$', is given by higher layer parameter DMRS-Type A-position, this can be either 2 or 3. While in mapping type B, the position of front-loaded DMRS 'l$_0$', is always 0. When frequency hopping is disabled, set of two tables define 3-4" are defined in the standards to calculate PUSCH DMRS positions $\bar{l}$ depending on the number of front loaded symbols and mapping type.

l'={0,1}, defines the presence of single or double front loaded DMRS and the supported antenna ports for a given l'.

With the values of l' and $\bar{l}$, calculate the exact positions of DMRS symbol 'l' from, l=$\bar{l}$+l'. When single front-loaded DMRS is scheduled, l will be same as $\bar{l}$, in double front loaded DMRS $$l=\{\{\bar{l}\},\{\bar{l}+1\}\}$$

The calculation of tone number k depends on configuration type i.e. either 1 or 2.

Figure 2A:
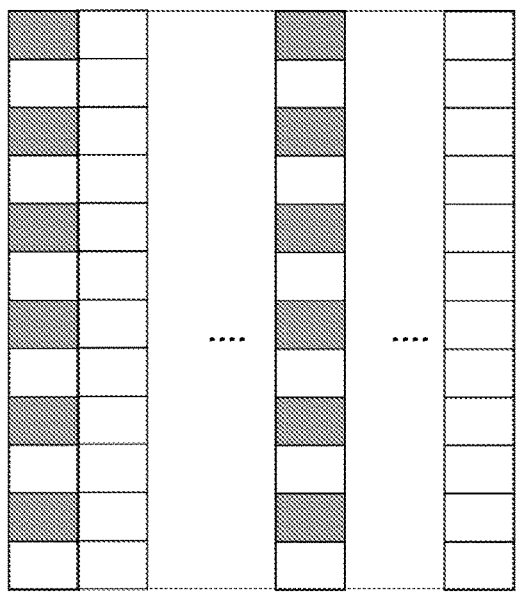
FIG. 2A shows a demodulation reference signal (DMRS) tone mapping for configuration type 1, in accordance with an embodiment of the present disclosure.
Figure 2A:
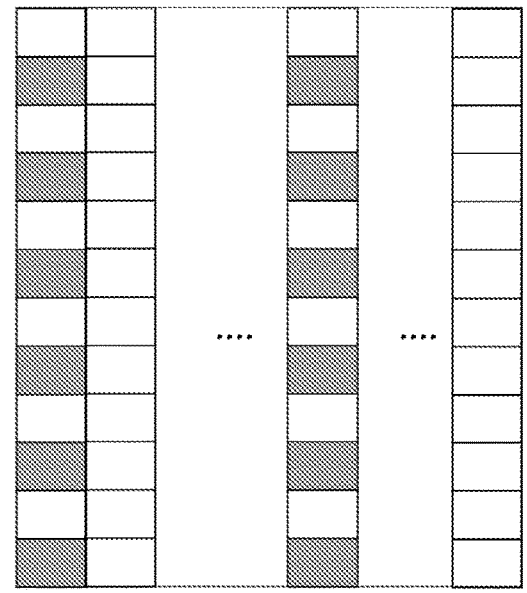

FIG. 2A shows a demodulation reference signal (DMRS) tone mapping for configuration type 1, in accordance with an embodiment of the present disclosure. For configuration type 1, for a given port index, the DMRS samples will be on the alternative tones of a PRB. This is expressed using the below equation as:

$$k=4n+2k'+\Delta$$

where, k'=0,1

$\Delta=\{0,1\}$

Depending on the port index, the values of $\Delta$, $w_f(k')$ and $w_t(l')$ are obtained and ports {4, 5, 6, 7} are used only in presence of double front loaded DMRS, while the other ports are used in presence of both double and single front loaded DMRS scheduling, which is shown in FIG. 2A. The value of $\Delta$ Corresponds to CDM group, which makes the tone indices in PRB to be odd tones (1, 3, 5 . . . ) or even tones (0, 2, 4, 6 . . . ). In other words, the ports corresponding to $\Delta$=0 occupy even tones, while ports corresponding to $\Delta$=1 occupy odd tones. The resource mapping of configuration type 1 for one PRB with an additional symbol at 4 is as shown in FIG. 2A.

Figure 2B:
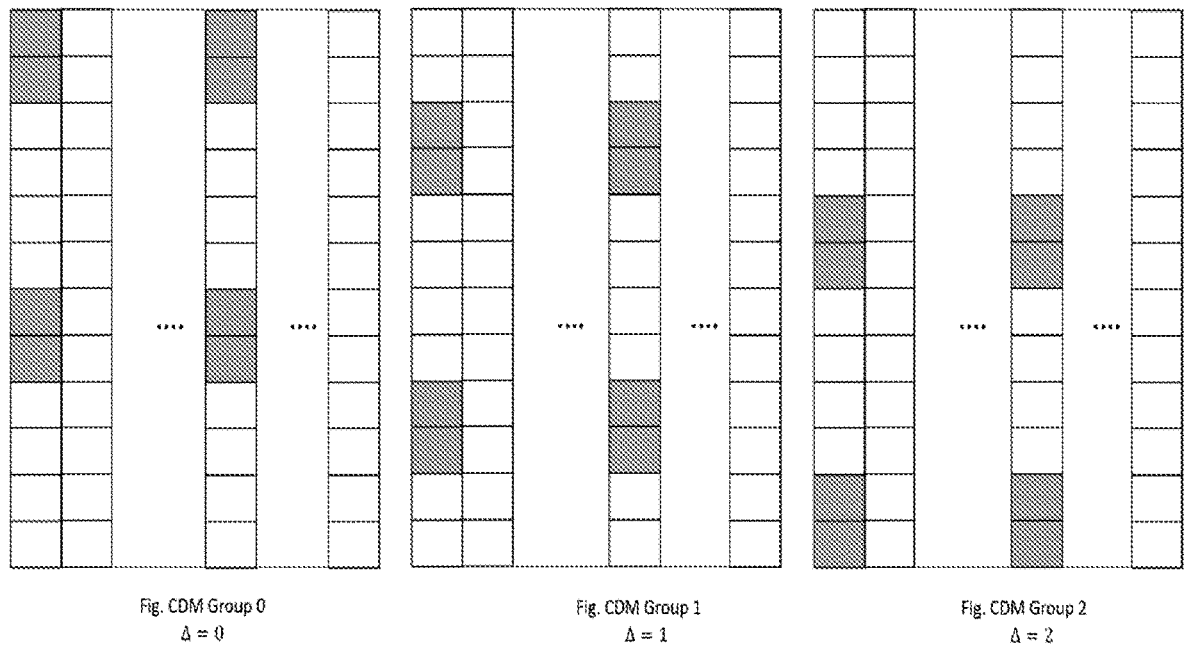
FIG. 2B shows a DMRS tone mapping for configuration type 2, in accordance with an embodiment of the present disclosure.
Figure 2C:
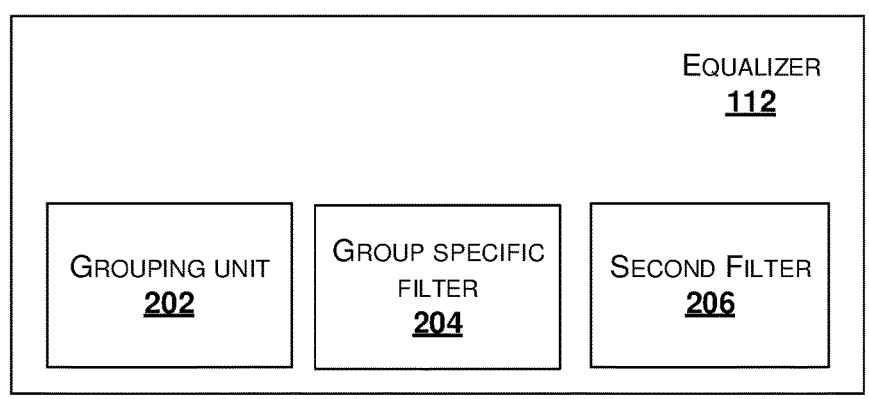
FIG. 2C shows a block diagram of an equalizer, in accordance with an embodiment of the present disclosure.

FIG. 2B shows a DMRS tone mapping for configuration type 2, in accordance with an embodiment of the present disclosure. In the configuration type 2, for a given port index the DMRS samples will be on two consecutive tones for every six tones in a PRB. This is expressed using the below equation as $$k=6n+k'+\Delta$$

where, k'=0,1

$\Delta=\{0, 1, 2\}$

Depending on the port number the values of $\Delta$, $w_f(k')$ and $w_t(l')$ are obtained. Ports {6, 7, 8, 9, 10, 11} are used for double front loaded DMRS while the other ports used in presence of both double and single front loaded DMRS scheduling, as shown in FIG. 2B. The value of $\Delta$ corresponds to the CDM group, this makes the tones in a PRB to tones of pack {0, 1, 6, 7}, {2, 3, 8, 9}, {4, 5, 10, 11} respectively for $\Delta=\{0, 1, 2\}$. The resource mapping of configuration type 2 for one PRB with an additional symbol at 4 is as shown in FIG. 2B. Considering $\beta_{pusch}$=1, W=I$_{n_j}$, The intermediate quantity $\tilde{a}_{k,l}^{(\tilde{p}j\mu)}$ mapped to physical resources according to, $$x_j(k)=\tilde{a}_{k,l}^{(\tilde{p}j\mu)}$$

Referring back to FIG. 1, the FFT unit 108 output at a given received antenna 'i' after sub carrier de-mapper is represented as, $$\bar{y}^i=\Sigma_{j=1}^N \bar{h}_j^i \bar{x}_j + \bar{n}^i$$

where, $\bar{y}^i$—Received vector of size $N_{SC}\times 1$ on received antenna 'i'.

$\bar{h}_j^i$—Channel state of user 'j' on antenna 'i' of size $N_{sc}\times 1$ $\bar{x}_j$—DMRS of user 'j' with size $N_{SC}\times 1$.

$$\bar{y}^i=[y^i(1)y^i(2) \ldots y^i(N_{SC})]^T$$

$$\bar{h}_j^i=[h_j^i(1)h_j^i(2) \ldots h_j^i(N_{SC})]^T$$

$$\bar{x}_j=[x_j(1)x_j(2) \ldots x_j(N_{SC})]$$

In an embodiment, multiple CDM groups are orthogonalized in frequency. Hence, channel estimation is performed on each CDM group independently across all receive antennas.

The channel estimator 114 performs channel estimation for a CDM group by considering $N_{lc}$ as the number of layers configured on a CDM group, A method to estimate the channel of the layers on the CDM group comprises stacking all the received DMRS tones corresponding to a CDM group on a given antenna in vector format. Also, the method comprises transforming DMRS symbol of each layer into a diagonal matrix and concatenate all the diagonal DMRS matrices into a matrix. Thereafter, multiplying Hermitian of above-appended matrix with the stacked received DMRS signal.

The received DMRS vector on an antenna i can be represented as given in equation $$\bar{r}^i = H^i \bar{z} + \bar{n}^i \qquad (7)$$

$$r(k) = \sum_{j=1}^{N_{lc}} h_j^i(k) x_j(k) + n(k)$$

Where, k: tone indices corresponding to a CDM GROUP $\bar{r}^i: \frac{N_{SC}}{C} \times 1$ recieved vector on $i^{th}$ antenna.

$$H^i = [\text{diag}(\bar{h}_1^i) \ldots \text{diag}(\bar{h}_{N_{lc}}^i)]$$

$$\bar{z} = \begin{bmatrix} \bar{x}_1 \\ \vdots \\ \bar{x}_{N_{lc}} \end{bmatrix}$$

By invoking equation and the fact that diagonal matrix multiplication is equivalent to Kronecker delta product equation (7) may be expressed as:

$$\bar{r}^i = X\bar{h}^i + \bar{n}^i \qquad (8)$$

-continued where, $$\bar{h}^i = \begin{bmatrix} \bar{h}^i_1 \\ \vdots \\ \bar{h}^i_{N_{lc}} \end{bmatrix}$$

$$X = [\text{diag}(\bar{x}_1) \ldots \text{diag}(\bar{x}_{N_{lc}})]$$

Also, invoking Least squares principle on equation (8) to generate simultaneous channel estimates for all layers on antenna 'i'.

$$\tilde{\bar{h}}^i = X^\dagger \bar{r}^i \quad (9)$$
$$= X^\dagger (X\bar{h}^i + \bar{n}^i)$$
$$= X^\dagger X\bar{h}^i + X^\dagger \bar{n}^i)$$
$$= \bar{h}^i + \text{residual error} + \text{noise}$$

$$\tilde{H} = \text{reshape}(\tilde{\bar{h}}^i)$$

where, $$\tilde{\bar{h}}^i = \begin{bmatrix} \hat{\bar{h}}^i_1 \\ \vdots \\ \hat{\bar{h}}^i_{N_{lc}} \end{bmatrix}$$

$$\hat{\bar{h}}^i_j = \begin{bmatrix} \hat{h}^i_j(1) \\ \vdots \\ \hat{h}^i_j\left(\frac{N_{SC}}{C}\right) \end{bmatrix}$$

$\tilde{H}$: is a $$\frac{N_{SC}}{N_t} \times N_{lc}$$

matrix with each column being $$\frac{N_{SC}}{N_t}$$

channel states of $j^{th}$ layer on the particular CDM Group.

$$\acute{H} = [\hat{\bar{h}}_1^i \ldots \hat{\bar{h}}_{N_{lc}}^i]$$

The equation (9) is repeated for all receive antennas for a CDM group. For any CDM group, the same process can be followed with a change in the DMRS positions on the tones.

One embodiment of the present disclosure is to perform time offset estimation and correction. In presence of Time offset, the channel estimates will be multiplied by an exponential constant i.e. shift in time domain results in multiplication of exponential value in frequency domain. The channel estimator performs time offset estimation using the below equation:

$$y^i(k) = \sum_{j=0}^{1} h^i_j(k) x_j(k) e^{j\theta_i k} + n_i(k)$$

where, $y^i(k)$-Received value on received antenna 'i'.

$h^i_j(k)$-Channel state of layer 'j' on antenna 'i'

$x_j(k)$-DMRS of layer 'j'

$k = \{0, 1, 2, \ldots N_{SC} - 1\}$ $$\theta_i = \frac{2\pi\epsilon_i}{N}$$

The effect of $\theta_i$ on channel estimates is expressed by the following equation, $$\hat{h}^i_j(k) = h^i_j(k) \times e^{j\theta_i k} + \text{interference} + \text{noise}$$

The time offset is estimated by the following steps:
Calculating an offset angle of layers on a CDM group 'q' on a given symbol is given by, $$p^s_{1i,c} = \left(\frac{1}{\frac{N_{SC}}{2C} - 1}\right) \sum_{m=1}^{\frac{N_{SC}}{2C}-1} \left(\hat{h}_i(2m-1)(\hat{h}_i(2m+1))^*\right)$$

$$p^s_{2i,c} = \left(\frac{1}{\frac{N_{SC}}{2C} - 1}\right) \sum_{m=1}^{\frac{N_{SC}}{2C}-1} \left(\hat{h}_i(2m)(\hat{h}_i(2m+2))^*\right)$$

$$p^s_{i,c} = \frac{1}{2}(p^s_{1i,c} + p^s_{2i,c})$$

Repeating the procedure for all available DMRS symbols and all CDM groups configured average it further for effective offset phasor value, $$q_i = \frac{1}{S \times C} \sum_{c=1}^{C} \sum_{s=1}^{S} p^s_{i,c}$$

where S is Maximum number of DMRS symbols in allocated PUSCH resources

Calculating final offset angle by calculating the phasor offset for all receiver antennas and further averaging over all the antennas to obtain $$\hat{\theta} = \frac{1}{N_r} \angle \left(\sum_{n=1}^{N_r} q_i\right)$$

The channel estimator 114 after identifying the time offset corrects the time offset. In an example embodiment for single user multiple-input and multiple-output (SU-MIMO), the offset on all the layers will be same. So, de-rotation of channel estimates and the equalized values is sufficient for time offset correction. The method of time offset correction comprises de-rotating the channel estimates after Least Squares by multiplying with $e^{-j\hat{\theta}k}$, $$\tilde{h}^i_j(k) = \hat{h}^i_j(k) \times e^{-j\hat{\theta}k}$$

Also, the method comprises de-rotating the equalization samples with the estimated offset.

$$\tilde{z}(k) = z(k) e^{-j\hat{\theta}k}$$

To minimize the interference between the layers configured on the same CDM group and noise, 'G1' on consecutive channel estimates corresponding to a user/layer in a CDM group are averaged. Considering 'G1' consecutive channel estimates and channel to be identical across these 'G1×C' tones, averaging is performed and repeated the resultant channel estimate across these 'G1×C' tones. In 5G NR, considering the structure of DMRS of all layers, possible values of G1 2,6.

In one embodiment, depending on the higher layer parameter, the number of DMRS symbols for a given PUSCH duration is completely configurable. The least, number of DMRS symbols for a given allocation is '1' and a maximum of '4' DMRS symbols for the given duration of PUSCH. For equalizing data symbols, channel estimates are required on all data symbols present in a PUSCH allocation, for that an interpolation is required.

In an embodiment, the channel estimator 114 comprises an interpolator to perform interpolation of DMRS symbols. Considering an example of one symbol (single front-loaded) in an allocation, the channel over all the other symbols is the channel on the DMRS symbol. For DMRS symbols of 2, 3 or 4 for a PUSCH allocation a linear interpolator is used.

After the channel estimation is performed, an equalizer 112 is used to counter distortions incurred by the multipath channel on the transmitted signal and to suppress the interference from co-channel or other cells that got leaked into the signal. The equalizer 112 is a vector-valued frequency domain MMSE filter, in an embodiment. Also, the equalizer is configured with an Interference rejection combiner (IRC) to suppress the dominant interference from adjacent or co-channel cells. Depending on use case the IRC module may be enabled or disabled.

In an embodiment, the FFT unit 108 output per tone in each of the plurality antennas (not shown in figures), configure in the receiver is represented as $$y(k)=H(k)x(k)+n(k) \quad (10)$$

where,
k: Subcarrier index $[0, N_{SC}-1]$
y: Received vector of size: $N_r \times 1$
H: Channel matrix of size: $N_r \times N_u$
x: Data symbol vector of size: $N_u \times 1$
n: Noise vector of size: $N_r \times 1$ To counter the effects of the multipath channel, a frequency domain vector-valued MMSE filter is applied on the frequency domain received samples $$z(k)=w(k)y(k)$$

where w(k) is MMSE filter

Referring to FIG. 2C, the second filter or MMSE filter 206 minimizes the mean squared error between equalized data samples and actual frequency domain data samples. The error between the MMSE output z(k) and the input x(k) may be written as, $$e(k)=z(k)-x(k)$$

Means squared error=$E(\|e(k)\|^2)$.

w(k) value obtained has to minimize the mean squared error.

$$w(k) = \underset{w(k)}{\mathrm{argmin}} E[\|e(k)\|^2]$$

In another embodiment, the MMSE filter may use orthogonality principle, that is an error vector will always be orthogonal to received data vector, represented as.

$$E(e(k)y^\dagger(k))=0$$

Substituting e(k) in the above equation and solving results in.

$$w(k) = R_{xy}(k) \times R_{yy}^{-1}(k) \quad (11)$$
$$R_{xy}(k) = E[x(k)y^\dagger(k)]$$
$$= R_{xx}(k)H^\dagger(k)$$
$$R_{yy}(k) = E[y(k)y^\dagger(k)]$$
$$= [H(k)R_{xx}(k)H^\dagger(k) + R_{nn}(k)]$$

$$R_{xx}(k) = E[x(k)x^\dagger(k)] \quad (12)$$
$$R_{nn}(k) = E[n(k)n^\dagger(k)]$$
$$w(k) = R_{xx}(k)H^\dagger(k)[R_{nn}(k) + H(k)R_{xx}(k)H^\dagger(k)]^{-1}$$

Matrix inversion lemma is applied on equation (10) to derive computationally efficient MMSE filter:

$$w(k)=[R_{xx}^{-1}(k)+H^\dagger(k)R_{nn}^{-1}(k)H(k)]^{-1}H^\dagger(k)R_{nn}^{-1}(k) \quad (13)$$

One embodiment is considering present of dominant interference, in which the equalizer 112 activates the Interference Rejection Combiner (IRC) 204 using an WC enabler (not shown in the figure). When the received signal or input signal 128 at the receiver 100 is contaminated with interference then the IRC in conjunction with MMSE filter is used to suppress the interference.

In an embodiment, considering the FET 108 output of received signal per tone containing adjacent/co-channel interference across all the plurality of antennas, configured in the receiver 100, is represented as $$y(k)=H(k)x(k)+G(k)s(k)+n(k) \quad (14)$$

G(k)s(k)+n(k) is interference.
where,
k: Subcarrier index $[0, N_{SC}-1]$
y: Received vector of size: $N_r \times 1$
H: Channel matrix of size: $N_r \times N_u$
x: Data symbol vector of size: $N_u \times 1$
n: Noise vector of size: $N_r \times 1$
G: Channel matrix of interferers' size: $N_r \times 1$
s: Data symbol vector of interferers of size: $N_i \times 1$
$N_i$: Number of other cell interferers
$N_j$: Number of uplink layers An interference and additive white Gaussian noise (AWGN) jointly may be referred as coloured noise. To mitigate the coloured noise, a second order statistics of colored noise is obtained and a pre-whitening filter is obtained using the second order statistics, which whitens the coloured noise contained on the received signals i.e. removes the coloured noise to obtain whitened received signals or filtered received signals. Thereafter, second filtering is performed on the whitened received signals using MMSE filter 206.

As shown in FIG. 2C, the equalizer 114 removes coloured noise (Interference and AWGN) using the following method comprising applying a noise Pre-whitening filter on interference corrupted received samples to whiten the coloured noise. Also, the pre-whitening filter is applied to channel estimates to minimize the impact of interference. Further, the pre-whitened channel estimates are used to build an MMSE filter using equation 3. Thereafter, the MMSE filter is used to obtained equalized signals from the pre-whitened received samples or signals.

Figure 2D:
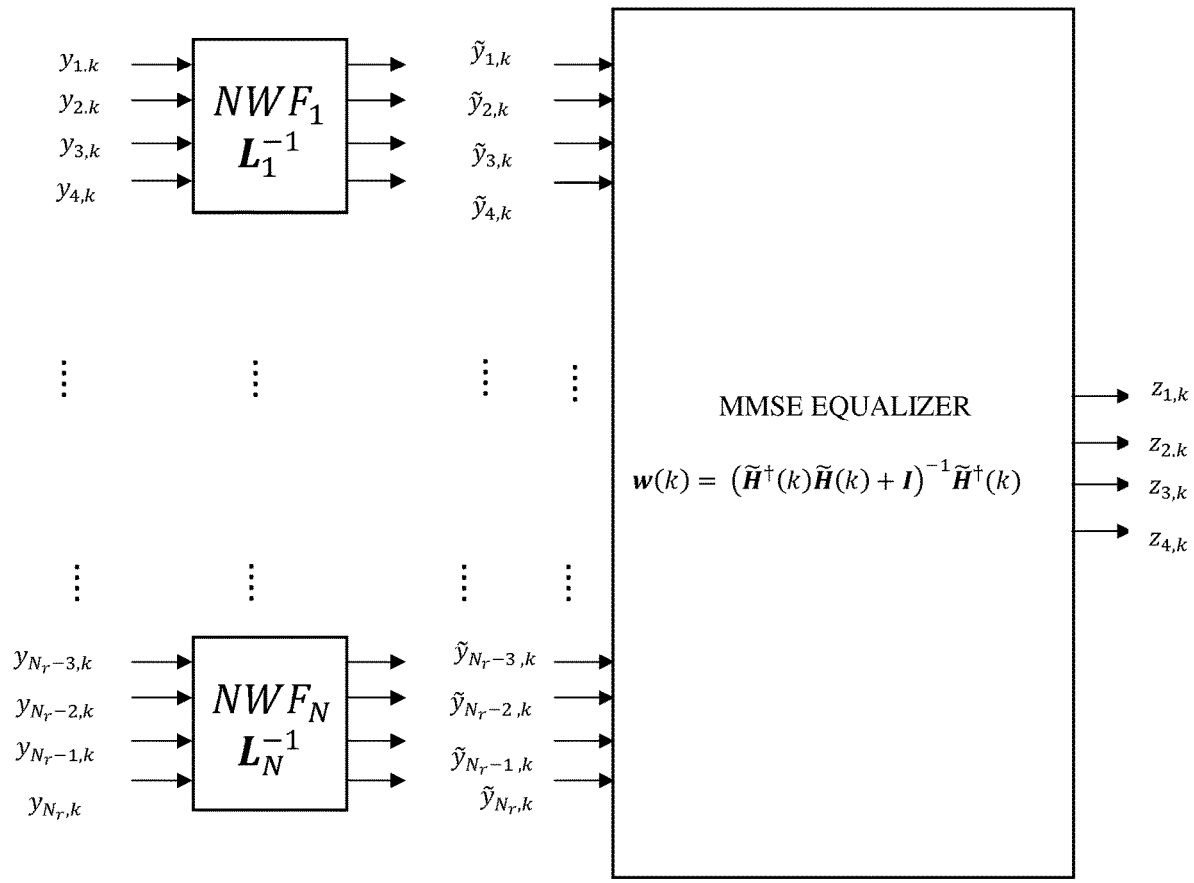
FIG. 2D shows an example illustration of an equalizer, in accordance with an embodiment of the present disclosure.
Figure 2E:
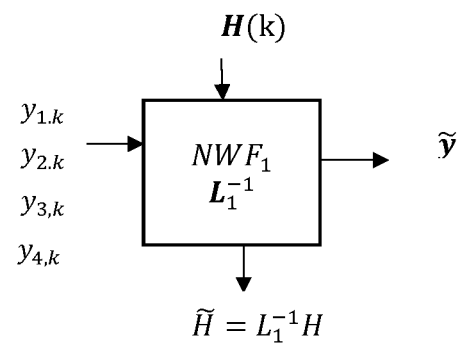
FIG. 2E shows an illustration of noise-whitening filter for an antenna group 1, in accordance with an embodiment of the present disclosure.

FIG. 2D shows an example illustration of an equalizer, in accordance with an embodiment of the present disclosure. FIG. 2E shows an illustration of noise-whitening filter for an antenna group 1, in accordance with an embodiment of the present disclosure. As shown in FIG. 2E, the method of Pre-whitening the Noise comprising the following steps:

First step is segmenting or grouping $N_r$ receive antennas into small groups. In an example embodiment, each group contains 4 receive antennas as shown in FIG. 2D. The number of receive antennas is scalable and not fixed as 4, i.e. the grouping of number of antennas is at least 2. In an embodiment, the grouping of antennas may be 2, 4, 8, 16, 32, 64.

Second step is designing a Noise-Whitening filter for each group, one per physical resource block (PRB). As an example, considering Group 1 containing receive antennas $N_{r1}$ $N_{r2}$ $N_{r3}$ $N_{r4}$ respectively as shown in FIG. 2E.

One embodiment is designing a Pre-whitening filter, which is achieved by acquiring second order statistics of Noise plus interference and perform the subsequent processing to stream out the interference on received data. The pre-whitening filter is obtained by performing:

For a given Antenna group i.e. considering group 1 from FIG. 2D as an example and computing the matrix $P_{nn}$ for each frequency tone. Using received DMRS symbol, transmitted DMRS symbol, estimated channel vector to derive covariance matrix. As layer multiplexing on a given tone is with respect to the CDM Group, for a given tone calculating the noise and interference value by subtracting the multiplexed data of the layers of that CDM group from the received value on the antenna.

$$p^1(t) = y^1_{DMRS}(t) - \Sigma_{cg} h^1_{cg}(t) x_{cg}(t)$$
$$p^2(t) = y^2_{DMRS}(t) - \Sigma_{cg} h^2_{cg}(t) x_{cg}(t)$$
$$p^4(t) = y^4_{DMRS}(t) - \Sigma_{cg} h^4_{cg}(t) x_{cg}(t)$$
$$p(t) = [p^1(t) p^2(t) \ldots p^4(t)]^T$$
$$P_{nn}(t) = p(t) p^\dagger(t)$$

where,
t is tone index respective to the CDM group
$y_{DMRS}^1(k)$ is received DMRS on tone k from Antenna
$N_{cg}$ is number of CDM layers on tone k
$\bar{h}_{cg}^1(k)$ is channel estimate of $cg^{th}$ layer on tone k
$X_{cg}(k)$ is transmitted DMRS form layer cg on tone k.
k={0, 1, 2, 3 . . . $N_{SC}$−1}

Considering 'G' (Presently G is set to 12) consecutive $P_{nn}$ matrices and computing mean, the resultant matrix may be Noise covariance matrix $R_{nn}$ for that PRB $$R_{nn}(k) = \frac{1}{G} * \sum_{t=1}^{G} P_{nn}(t)$$

Averaging and mapping to the tones is similar to tone averaging function in channel estimation. Applying Cholesky decomposition on the Covariance matrix $R_{nn}(k)$ (per PRB)

$$\text{Chol}(R_{nn}(k)) = LL^\dagger$$

The Inverse of the Lower triangular matrix obtained from the above step is a Noise whitening filter for that PRB of that group.

$$NWF = L^{-1}$$

Third step in the method of Pre-whitening the Noise is Pre-whitening of the received samples and channel estimates of a group is performed as mentioned below:

$$\begin{bmatrix} \tilde{y}^1(k) \\ \tilde{y}^2(k) \\ \tilde{y}^3(k) \\ \tilde{y}^4(k) \end{bmatrix} = L^{-1} \begin{bmatrix} y^1(k) \\ y^2(k) \\ y^3(k) \\ y^4(k) \end{bmatrix}$$

$$\begin{bmatrix} \tilde{h}_1^1(k) & \tilde{h}_2^1(k) & \ldots & \tilde{h}_{N_u}^1(k) \\ \tilde{h}_1^2(k) & \tilde{h}_2^2(k) & \ldots & \tilde{h}_{N_u}^2(k) \\ \tilde{h}_1^3(k) & \tilde{h}_2^3(k) & \ldots & \tilde{h}_{N_u}^3(k) \\ \tilde{h}_1^4(k) & \tilde{h}_2^4(k) & \ldots & \tilde{h}_{N_u}^4(k) \end{bmatrix} = L^{-1} \begin{bmatrix} h_1^1(k) & h_2^1(k) & \ldots & h_{N_u}^1(k) \\ h_1^2(k) & h_2^2(k) & \ldots & h_{N_u}^2(k) \\ h_1^3(k) & h_2^3(k) & \ldots & h_{N_u}^3(k) \\ h_1^4(k) & h_2^4(k) & \ldots & h_{N_u}^4(k) \end{bmatrix}$$

where, Superscript indicates Antenna number and Subscript: indicates layer number $[y^1(k) \ y^2(k) \ y^3(k) \ y^4(k)]^T$ -Is noisy received vector on tone 'k' for group 1

$$\begin{bmatrix} h_1^1(k) & h_2^1(k) & \ldots & h_{N_u}^1(k) \\ h_1^2(k) & h_2^2(k) & \ldots & h_{N_u}^2(k) \\ h_1^3(k) & h_2^3(k) & \ldots & h_{N_u}^3(k) \\ h_1^4(k) & h_2^4(k) & \ldots & h_{N_u}^4(k) \end{bmatrix}$$ -Noisy channel estimates on 'k' for group 1

At fourth step method of Pre-whitening the Noise, repeating all the above three steps for all allocated PRBs.

Finally, at fifth step repeating the above four steps for all groups.

One embodiment of the present disclosure is a MMSE filter 206 configured in the equalizer 144. The MMSE filter 206 is obtained using the below framework:

$$w(k) = (\tilde{H}^\dagger(k)\tilde{H}(k) + I)^{-1} \tilde{H}(k) \quad (15)$$

where, $\tilde{H}(k)$ is a $N_r \times N_l$ prewhitened channel matrix concatenated from all receive antennas for a given tone.

The MMSE filter is applied to the pre-whitened received samples stacked from all the receive antennas for a given tone k.

$$z(k) = w(k)\tilde{y}(k)$$

$$\tilde{y}(k) = \begin{bmatrix} \tilde{y}_1(k) \\ \tilde{y}_2(k) \\ \tilde{y}_3(k) \\ \vdots \\ \tilde{y}_{N_r}(k) \end{bmatrix}$$

where,
$N_r$— Receive antennas
$N_l$— Number of Layers
$N_g$— Number of Antennas in a group.

$N_{SC}^{RB}$—Number of Subcarriers per Resource Block

One embodiment of the present disclosure is absence of dominant interference during communication. When there is no dominant interference, the equalizer 112 disables IRC 204 and only MMSE filter 206 is used, such that:

$$y(k)=H(k)x(k)+n(k)$$

where, k: Sub-carrier index $[0, N_{SC}-1]$
y: Received vector of size: $N_r \times 1$
H: Channel matrix of size: $N_r \times N_l$
x: Data symbol vector of size: $N_l \times 1$
n: Noise vector of size: $N_r \times 1$ For the non-interference case, equation 4 may be written as $$w(k)=[N_0 I + H^\dagger(k)H(k)]^{-1}H^\dagger(k) \qquad (16)$$

where $N_0$ is the Noise variance

A method of compute noise variance comprises the following steps:

At step 1, obtaining an error vector for each tone using received DMRS and Transmitted DMRS and Estimated channel states.

$$p^1(t) = y^1(t) - \sum_{cg} h_{cg}^1(t) x_{cg}(t)$$

$$\vdots$$

$$p^i(t) = y^i(t) - \sum_{cg} h_{cg}^i(h) x_{cg}(t)$$

$$\vdots$$

$$p^{N_r}(t) = y^{N_r}(t) - \sum_{cg} t_{cg}^{N_r}(t) x_{cg}(t)$$

Where, t—Tone index corresponding to a CDM group

Next, repeating the above step for all the CDM groups.

$$V(k)=[p^1(k) \ldots p^{N_r}(k)]^T$$

Where,
$k=\{0, 1, 2, 3 \ldots, N_{SC}-1\}$

At Step 2, computing matrix $p_{nn}(k)=V^\dagger(k)V(k)$

Further, at step 3, repeating the above two steps for allocated number of tones.

Finally, at step 4 computing the mean of all generated $P_{nn}$ matrices to obtain Noise covariance, i.e. using equation:

$$r_{nn} = \frac{1}{N_{sc}} * \sum_{k=1}^{N_{sc}} p_{nn}(k)$$

Noise variance $N_0 = r_{nn}$

Figure 3:
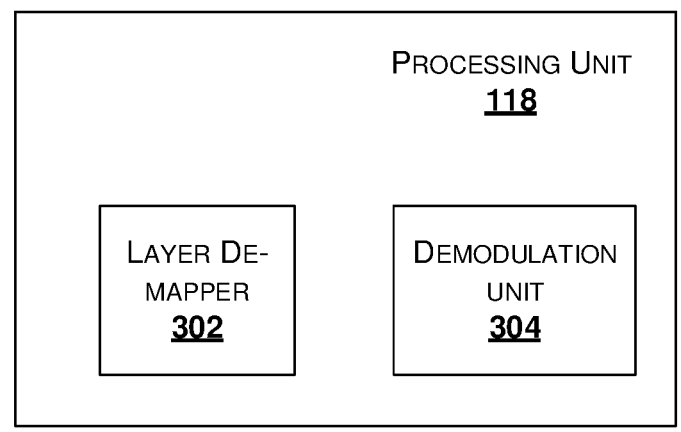
FIG. 3 shows a block diagram of a processing unit, in accordance with an embodiment of the present disclosure.

Referring back to FIG. 1, the processing unit 118 is configured to filter the second filtered signals to produce an output. FIG. 3 shows a block diagram of a processing unit, in accordance with an embodiment of the present disclosure. The processing unit 118 receives the second filtered signals from the, second filter or MMSE filter 206 configured in the equalizer 112 to perform demodulation to produce an output, said output is the received signal stream.

In an embodiment, the processing unit 118 comprises a layer de-mapper 302 and demodulation unit 304, as shown in FIG. 3. The layer de-mapper 302 is configured to perform layer de-mapping on the second filter signals to produce layer de-mapped signals. The demodulation unit 304 performs demodulation on the layer de-mapped signals to generate an output data.

Figure 4:
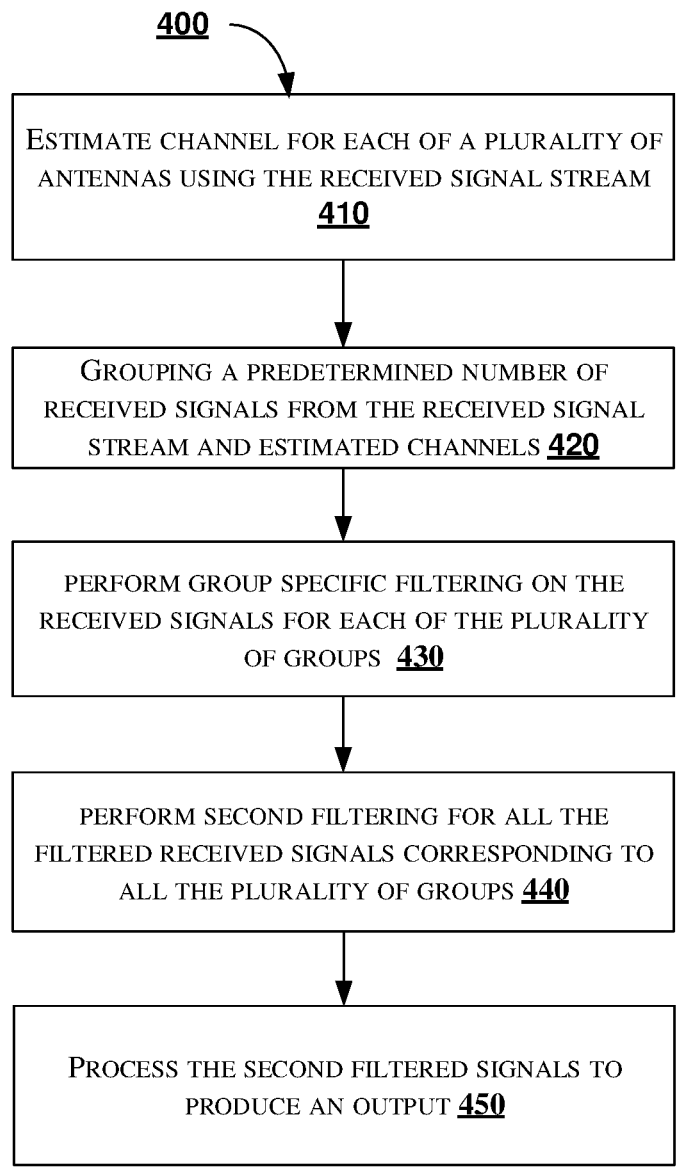
FIG. 4 shows a flowchart illustrating a method of receiving signal in a communication network, in accordance with an embodiment of the present disclosure.

FIG. 4 shows a flowchart illustrating a method of receiving a signal stream in a communication network, in accordance with an embodiment of the present disclosure.

As illustrated in FIG. 4, the method 400 comprises one or more blocks for detecting a data stream in a communication network. The order in which the method 400 is described is not intended to be construed as a limitation, and any number of the described method blocks can be combined in any order to implement the method. Additionally, individual blocks may be deleted from the methods without departing from the spirit and scope of the subject matter described herein. Furthermore, the method can be implemented in any suitable hardware, software, firmware, or combination thereof.

At block 410, estimating channel using channel estimator 114, configured in the receiver 100, for each of a plurality of antennas using the received signal stream, to produce a plurality of estimated channels.

In an embodiment, the received signal stream is pre-processed by performing at least one of converting the received signal stream intermediate frequency signal and removing cyclic prefix, to produce pre-processed signal stream. The pre-processed signal stream is transformed from time domain in to frequency domain using the FFT unit 108 to generate transformed signal stream. Thereafter, the transformed signal stream is de-mapped using a plurality of sub-carriers to generate de-mapped signals. The de-mapped signals may be used to estimate the channel using channel estimator 114.

At block 420, grouping is performed on a predetermined number of received signals from the received signal stream and estimated channels associated with the predetermined number of received signals to obtain a group. This operation of grouping is repeated on all the remaining received signals of the received signal stream to generate a plurality of groups. The grouping operation is performed by the grouping unit 202, configured in the equalizer 112.

At block 430, a group specific filtering is performed using, group specific filter or IRC 204 configured in the equalizer 112, on the received signals and corresponding estimated channels of each of the plurality of groups to obtain a filtered plurality of groups. Each of the filtered plurality of groups comprises filtered received signals and a plurality of filtered estimated channels. The group specific filtering remove interference and noise, using corresponding group channel estimate to obtain filtered plurality of groups.

At block 440, second filtering is performed, using the second filter or MMSE filter 206 configured in the equalizer, for all the filtered received signals corresponding to all the plurality of groups to produce second filtered signals or equalized signals.

To obtain equalize signals, the second filter 206 first merges all the filtered received signals corresponding to the filtered plurality of groups received from the group specific filter 204. Thereafter, the second filter 206 filters the merged filtered received signals using one of minimum mean square error (MMSE) filter to produce equalized signals.

At block 450, processing the second filtered signals is performed by the processing unit 118 to produce an output. The processing the second filtered signals is to demodulate the second filtered signals to produce an output, said output is the received signal stream. In an embodiment, the processing may comprise layer de-mapping on the second filter signals followed by demodulation to generate an output data.

The described operations may be implemented as a method, system or article of manufacture using standard programming and/or engineering techniques to produce software, firmware, hardware, or any combination thereof. The described operations may be implemented as code maintained in a "non-transitory computer readable medium", where a processor may read and execute the code from the computer readable medium. The processor is at least one of a microprocessor and a processor capable of processing and executing the queries. A non-transitory computer readable medium may comprise media such as magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), etc. Further, non-transitory computer-readable media comprise all computer-readable media except for a transitory. The code implementing the described operations may further be implemented in hardware logic (e.g., an integrated circuit chip, Programmable Gate Array (PGA), Application Specific Integrated Circuit (ASIC), etc.).

Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The transmission signals in which the code or logic is encoded is capable of being transmitted by a transmitting station and received by a receiving station, where the code or logic encoded in the transmission signal may be decoded and stored in hardware or a non-transitory computer readable medium at the receiving and transmitting stations or devices. An "article of manufacture" comprises non-transitory computer readable medium, hardware logic, and/or transmission signals in which code may be implemented. A device in which the code implementing the described embodiments of operations is encoded may comprise a computer readable medium or hardware logic. Of course, those skilled in the art will recognize that many modifications may be made to this configuration without departing from the scope of the invention, and that the article of manufacture may comprise suitable information bearing medium known in the art.

A description of an embodiment with several components in communication with each other does not imply that all such components are required. On the contrary a variety of optional components are described to illustrate the wide variety of possible embodiments of the invention.

When a single device or article is described herein, it will be clear that more than one device/article (whether they cooperate) may be used in place of a single device/article. Similarly, where more than one device or article is described herein (whether they cooperate), it will be clear that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments of the invention need not include the device itself.

Finally, the language used in the specification has been principally selected for readability and instructional purposes, and it may not have been selected to delineate or circumscribe the inventive subject matter. It is therefore intended that the scope of the invention be limited not by this detailed description. Accordingly, the disclosure of the embodiments of the invention is intended to be illustrative, but not limiting, of the scope of the invention.

While various aspects and embodiments have been disclosed herein, other aspects and embodiments will be apparent to those skilled in the art. The various aspects and embodiments disclosed herein are for purposes of illustration and are not intended to be limiting.

What is claimed is:

1. A method of signal processing in a communication network, the method comprising:
   in a receiver:
      receiving a plurality of signals corresponding to a plurality of antennas;
      grouping the plurality of signals into a plurality of signal groups;
      generating one or more group specific filtered signals by filtering one or more signals in a specific signal group of the plurality of signal groups by a first filter, wherein a configuration of the first filter is determined according to at least one signal in the specific signal group, and wherein the first filter is configurable to operate as a group specific interference rejection combining (IRC) filter and a group specific noise-pre-whitening filter; and
      generating one or more equalized signals by filtering the one or more group specific filtered signals by a second filter operating in a determined configuration.

2. The method as claimed in claim 1, wherein the specific signal group comprises a data signal and a reference signal.

3. The method as claimed in claim 1, wherein the specific signal group comprises at least one user, and wherein the at least one user has at least one layer.

4. The method as claimed in claim 1, wherein the first filter is determined according to estimated channel state information associated with the specific signal group.

5. The method as claimed in claim 1, wherein the first filter is determined according to a measured interference covariance associated with the specific signal group.

6. The method as claimed in claim 1, wherein the second filter is determined according to the one or more group specific filtered signals, and wherein the specific signal group comprises one or more data signals and one or more reference signals.

7. The method as claimed in claim 1, wherein the second filter is determined according to estimated channel state information associated with the one or more group specific filtered signals.

8. The method as claimed in claim 1, wherein the second filter is determined according to a measured interference covariance associated with the one or more group specific filtered signals.

9. The method as claimed in claim 1, wherein the second filter is one of an interference rejection combining (IRC) filter, a matched filter, a minimum mean square error (MMSE) filter, and a minimum mean square error-interference rejection combining (MMSE-IRC) filter.

10. A receiver, wherein the receiver comprises:
    a first filter operable to generate one or more group specific filtered signals by filtering one or more signals in a specific signal group of a plurality of signal groups, wherein the plurality of signal groups comprise signal received from a plurality of antennas, and wherein a configuration of the first filter is determined according to at least one signal in the specific signal group, and wherein the first filter is configurable to operate as a group specific interference rejection combining (IRC) filter and a group specific noise-pre-whitening filter; and a second filter operable to generate one or more equalized signals by filtering the one or more group specific filtered signals, wherein the second filter operates in a determined configuration.

11. The receiver as claimed in claim 10, wherein the specific signal group comprises a data signal and a reference signal.

12. The receiver as claimed in claim 10, wherein the specific signal group comprises at least one user, and wherein the at least one user has at least one layer.

13. The receiver as claimed in claim 10, wherein the first filter is determined according to estimated channel state information associated with the specific signal group.

14. The receiver as claimed in claim 10, wherein the first filter is determined according to a measured interference covariance associated with the specific signal group.

15. The receiver as claimed in claim 10, wherein the second filter is determined according to the one or more group specific filtered signals, and wherein the specific signal group comprises one or more data signals and one or more reference signals.

16. The receiver as claimed in claim 10, wherein the second filter is determined according to estimated channel state information associated with the one or more group specific filtered signals.

17. The receiver as claimed in claim 10, wherein the second filter is determined according to a measured interference covariance associated with the one or more group specific filtered signals.

18. The receiver as claimed in claim 10, wherein the second filter is one of an interference rejection combining (IRC) filter, a matched filter, a minimum mean square error (MMSE) filter, and a minimum mean square error-interference rejection combining (MMSE-IRC) filter.

* * * * *